United States Patent
Iimori (10) Patent No.: US 7,418,375 B2
(45) Date of Patent: Aug. 26, 2008

(54) LOAD CURRENT EVALUATION DEVICE, LOAD CURRENT EVALUATION METHOD, AND RECORDING MEDIUM CONTAINING LOAD CURRENT EVALUATION PROGRAM

(75) Inventor: Yasuo Iimori, Kosai (JP)

(73) Assignee: Yazaki Corporation, Tokyo (JP)

( * ) Notice: Subject to any disclaimer, the term of this patent is extended or adjusted under 35 U.S.C. 154(b) by 268 days.

(21) Appl. No.: 10/556,778

(22) PCT Filed: Jun. 30, 2004

(86) PCT No.: PCT/JP2004/009569

§ 371 (c)(1),
(2), (4) Date: Nov. 14, 2005

(87) PCT Pub. No.: WO2005/004009

PCT Pub. Date: Jan. 13, 2005

(65) Prior Publication Data

US 2007/0038427 A1 Feb. 15, 2007

(30) Foreign Application Priority Data

Jul. 4, 2003 (JP) ............................. 2003-191984

(51) Int. Cl.
*G06F 17/50* (2006.01)
(52) U.S. Cl. .................. 703/14; 703/2; 716/5
(58) Field of Classification Search ............ 703/13, 703/14, 2, 8; 716/5, 6; 307/40
See application file for complete search history.

(56) References Cited

U.S. PATENT DOCUMENTS 4,042,830 A * 8/1977 Kellenbenz et al. ........... 307/40

(Continued)

FOREIGN PATENT DOCUMENTS

JP     2000-202232     7/2000

(Continued)

OTHER PUBLICATIONS

Bogliolo et al., A. Gate-Level Power and Current Simulation of CMOS Integrated Circuits, IEEE Transactions on Very Large Scale Integration (VLSI) Systems, vol. 5, No. 4, Dec. 1997, pp. 473-488.*

(Continued)

*Primary Examiner*—Russell Frejd
(74) *Attorney, Agent, or Firm*—Sughrue Mion, PLLC (57) ABSTRACT

A load electric current evaluating device includes a load electric current calculating section for calculating a load electric current flowing through a predetermined part of electric wiring including a load part, a protecting part for the load part, an electric wire and an electric power source at the normal time; a storing section for storing load part information showing electric characteristics of the load part and protecting part information showing electric characteristics and a rated value of the protecting part; an information reading section for reading the load part information and the protecting part information from the storing section; an evaluation reference providing section for making an evaluation reference for evaluating adaptability of the load electric current flowing through the predetermined part at the normal time with reference to the load part information and the protecting part information; an evaluating section for evaluating the adaptability of the calculated load electric current on the basis of the evaluation reference; and an output section for outputting an evaluation result provided by the evaluating section.

6 Claims, 6 Drawing Sheets

U.S. PATENT DOCUMENTS

| | | | |
|---|---|---|---|
| 6,038,383 A | * | 3/2000 | Young et al. ................... 716/5 |
| 6,523,154 B2 | * | 2/2003 | Cohn et al. ................... 716/6 |
| 2002/0004715 A1 | | 1/2002 | Iimori |

FOREIGN PATENT DOCUMENTS

| | | |
|---|---|---|
| JP | 2001-518671 A | 10/2001 |
| JP | 2002-24314 A | 1/2002 |
| KR | 2002-0004875 | 1/2002 |
| WO | WO 99/17238 A1 | 4/1999 |

OTHER PUBLICATIONS

Persad et al., C. A Comparison of the Wear Behaviors of Six Elemental Wire Conductors, IEEE Transactions on Magnetics, vol. 31, No. 1, Jan. 1995, pp. 746-751.*

Bellil et al., K. On-State Transient Electrothermal Modeling of Large Area Power Components and Multichip Power Modules, IEEE Int. Workshop on Integrated Power Packaging, Sep. 1998, pp. 23-29.*

* cited by examiner

LOAD CURRENT EVALUATION DEVICE, LOAD CURRENT EVALUATION METHOD, AND RECORDING MEDIUM CONTAINING LOAD CURRENT EVALUATION PROGRAM

TECHNICAL FIELD

The present invention relates to a device for evaluating the adaptability of a load electric current flowing through a predetermined part in electric wiring within a vehicle including a predetermined load part, a protecting part, an electric wire and an electric power source, its method and a recording medium recording its program.

BACKGROUND ART

In recent years, the developing period of an automobile tends to be more and more shortened. In accordance with this tendency, the developing period of an electric mounting device mounted to the automobile also tends to be shortened. Many techniques for simulating the electric wiring including the load part, the electric wire, a switching device and the electric power source are proposed from such a present situation. For example, JP-A-2002-24314 shows a device in which plural electric parts are selectively arranged on an input screen, and names and formats of these electric parts are inputted and predetermined desirable electric wiring is performed, and protecting part fusion and wiring smoking at a short-circuiting time in this electric wiring are then simulated.

However, in accordance with the above relating simulator, the electric wiring at the short-circuiting time is evaluated, but no evaluation of the electric wiring at the normal time occupying a large portion of an operating time is particularly made. Further, in the evaluation of the electric wiring of the vehicle, its evaluation reference should be changed in accordance with a maker name of the vehicle mounting this electric wiring, the kind of the protecting part, an arranging place of the protecting part, or the kind of the vehicle mounting the electric wiring, and the state of a switching device. However, no consideration is taken until these points in the above relating simulator. Accordingly, a simulator able to accurately make such a characteristic evaluation of the electric wiring of the vehicle is eagerly desired.

DISCLOSURE OF THE INVENTION

In consideration of the above present situation, a subject of the present invention is to provide a device able to accurately evaluate the adaptability of the load electric current at the normal time in the electric wiring of the vehicle, its method and a recording medium for recording its program. Another subject of the present invention is to provide a device having a clear evaluation reference and able to accurately evaluate the adaptability of the load electric current in a different part, its method and a recording medium for recording its program.

To solve the above subjects, a load electric current evaluating device comprises:

a load electric current calculating section that calculates a load electric current flowing through a predetermined part of electric wiring including a load part, a protecting part for the load part, an electric wire and an electric power source at the normal time;

a storing section that stores load part information showing electric characteristics of the load part and protecting part information showing electric characteristics and a rated value of the protecting part;

an information reading section that reads the load part information and the protecting part information from the storing section;

an evaluation reference providing section that provides an evaluation reference for evaluating adaptability of the load electric current flowing through the predetermined part at the normal time with reference to the load part information and the protecting part information;

an evaluating section that evaluates the adaptability of the calculated load electric current on the basis of the evaluation reference; and an output section that outputs an evaluation result provided by the evaluating section.

In accordance with the above construction, the evaluation reference for evaluating the adaptability of the load electric current is made by utilizing the rated value of the protecting part with reference to the load part information and the protecting part information stored in advance. With reference to this evaluation reference, the adaptability of the load electric current flowing through a predetermined part at the normal time is evaluated in the electric wiring within the vehicle, and this evaluation result is outputted. Thus, since the rated value of the protecting part is utilized to make the evaluation reference of the load electric current, the evaluation reference is very clarified.

Preferably, the evaluation reference is constructed by a comparison formula in which the load electric current is multiplied by a predetermined coefficient together with the rated value of the protecting part.

In accordance with the above construction, the evaluation reference is more easily made.

It is preferable that the storing section stores evaluation relating information. The evaluation relating information includes information of at least one of a maker name of a vehicle mounting the electric wiring, an arranging place of the protecting part and the kind of the vehicle on which the electric wiring is mounted. The evaluation reference is classified into plural kinds on the basis of the evaluation relating information, the load part information and the protecting part information.

In accordance with the above construction, evaluation references respectively adapted for various kinds of conditions and different parts can be made.

It is also preferable that the electric wiring includes a switching device. The load electric current evaluating device, further includes a switching device setting section that sets a switching state of the switching device; and a path retrieving section that retrieves a path adapted to the switching state and required to calculate the load electric current in the electric wiring.

In accordance with the above construction, the switching state of the switching device included in the electric wiring is set and the adaptability of each load electric current corresponding to the switching state can be evaluated.

Preferably, the load electric current evaluating device further includes an evaluation report providing section that makes an evaluation report as the evaluation result, the evaluation report being related to the load part, the protecting part for the load part, the calculated load electric current and the evaluation result.

In accordance with the above construction, the evaluation report for correspondingly setting the load part, the protecting part of this load part, the calculated load electric current and the evaluation result is made as the evaluation result. Accordingly, the evaluation result is easily confirmed.

A load electric current evaluating method of the present invention comprises:

a load electric current calculating process for calculating a load electric current flowing through a predetermined part of electric wiring including a load part, a protecting part for the load part, an electric wire and an electric power source at the normal time;

an information reading process for reading load part information showing electric characteristics of the load part and protecting part information showing electric characteristics and a rated value of the protecting part;

an evaluation reference providing process for making an evaluation reference for evaluating adaptability of the load electric current flowing through the predetermined part at the normal time with reference to the load part information and the protecting part information;

an evaluating process for evaluating the adaptability of the calculated load electric current on the basis of the evaluation reference; and an output process for outputting an evaluation result provided by the evaluating section.

In accordance with the above method, the evaluation reference for evaluating the adaptability of the load electric current is made by utilizing the rated value of the protecting part with reference to the load part information and the protecting part information stored in advance. With reference to this evaluation reference, the adaptability of the load electric current flowing through a predetermined part at the normal time is evaluated in the electric wiring within the vehicle, and this evaluation result is outputted. Thus, since the rated value of the protecting part is utilized to make the evaluation reference of the load electric current, the evaluation reference is very clarified.

A recording medium recording a load electric current evaluating program, the program includes:

a load electric current calculating process for calculating a load electric current flowing through a predetermined part of electric wiring including a load part, a protecting part for the load part, an electric wire and an electric power source at the normal time;

an information reading process for reading load part information showing electric characteristics of the load part and protecting part information showing electric characteristics and a rated value of the protecting part;

an evaluation reference providing process for making an evaluation reference for evaluating adaptability of the load electric current flowing through the predetermined part at the normal time with reference to the load part information and the protecting part information;

an evaluating process for evaluating the adaptability of the calculated load electric current on the basis of the evaluation reference; and an output process for outputting an evaluation result provided by the evaluating section.

In accordance with the above construction, a computer makes the evaluation reference for evaluating the adaptability of the load electric current by utilizing the rated value of the protecting part with reference to the load part information and the protecting part information stored in advance. With reference to this evaluation reference, the adaptability of the load electric current flowing through a predetermined part at the normal time is evaluated in the electric wiring within the vehicle, and this evaluation result is outputted. Thus, since the rated value of the protecting part is utilized to make the evaluation reference of the load electric current, the evaluation reference is very clarified.

BRIEF DESCRIPTION OF THE DRAWINGS

The above objects and effects of the present invention will become more apparent by the description in the detailed explanation of preferred embodiments with reference to the accompanying drawings.

BEST MODE FOR CARRYING OUT THE INVENTION

Figure 1:
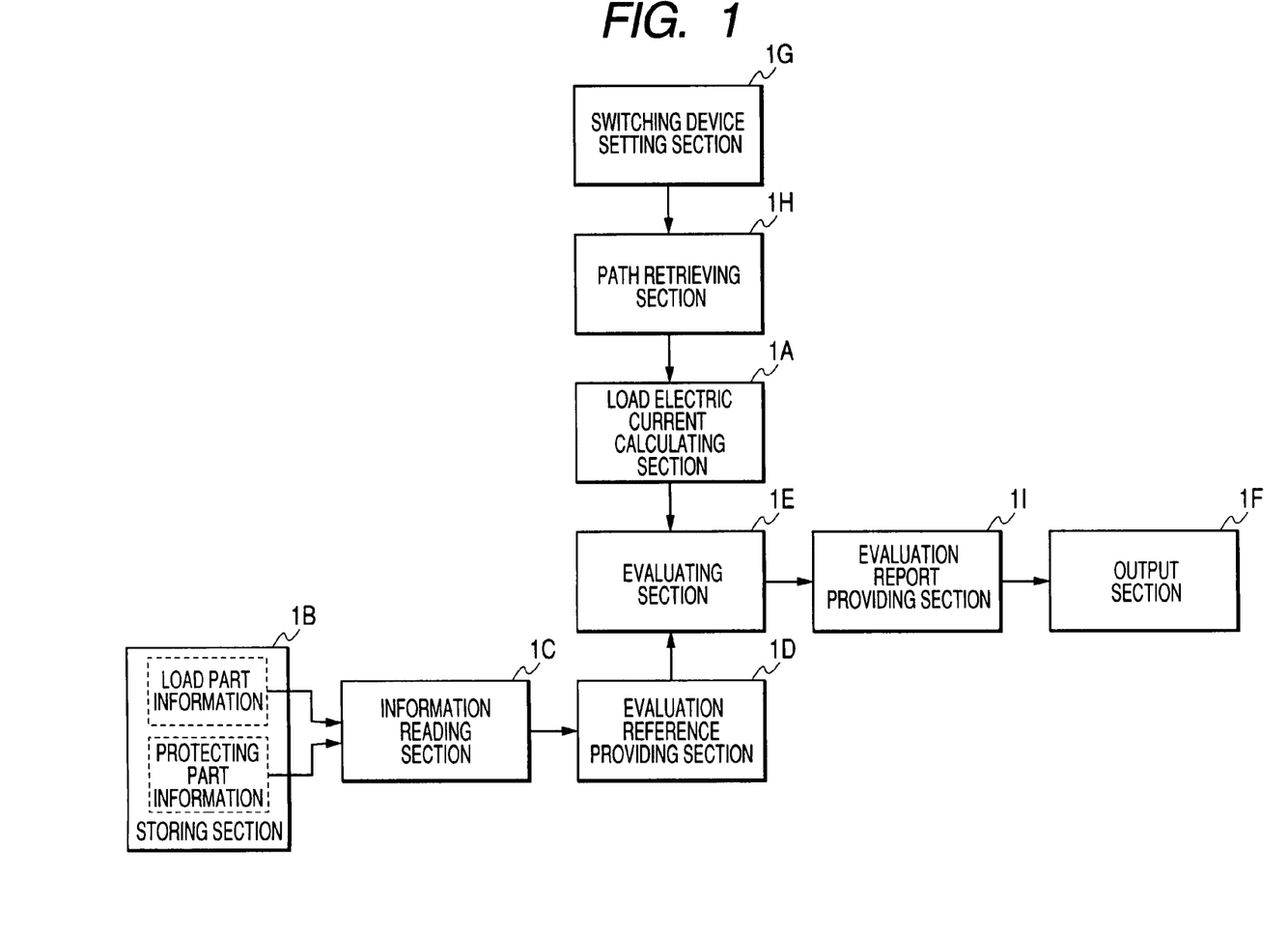
FIG. 1 is a block diagram showing the basic construction of a load electric current evaluating device of the present invention.

The embodiments of the present invention will next be explained on the basis of the drawings. FIG. 1 is a block diagram showing the basic construction of a load electric current evaluating device of the present invention. The basic constructional view of FIG. 1 shows a device for evaluating the adaptability of a load electric current flowing through a predetermined part at the normal time in electric wiring within a vehicle including a predetermined load part, a protecting part adapted for a load part allocated in advance, an electric wire and an electric power source. A load electric current calculating section 1A calculates a load electric current. A storing section 1B stores load part information showing the electric characteristics of a load part and protecting part information showing the electric characteristics of a protecting part. An information reading section 1C reads the load part information and the protecting part information. An evaluation reference providing section 1D provides an evaluation reference for evaluating adaptability of the load electric current flowing through a predetermined part at the normal time by utilizing a rated value of the protecting part with reference to the load part information and the protecting part information. An evaluating section 1E evaluates the adaptability of the calculated load electric current on the basis of the evaluation reference. An output section 1F outputs an evaluation result provided by the evaluating section 1E. Evaluation relating information includes information of at least one of a maker name of a vehicle mounting electric wiring thereto, an arranging place of the used protecting part, and the kind of the vehicle mounting the electric wiring thereto. The evaluation reference is classified into plural kinds on the basis of this evaluation relating information, the load part information and the protecting part information.

A switching device is also included in the electric wiring, and a switching device setting section 1G sets a switching state of the switching device. A path retrieving section 1H retrieves a path required to calculate the load electric current in the electric wiring and corresponding to the switching state. An evaluation report providing section 1I makes an evaluation report as an evaluation result for correspondingly setting the load part, the protecting part of the load part, the calculated load electric current and the evaluation result.

Figure 2:
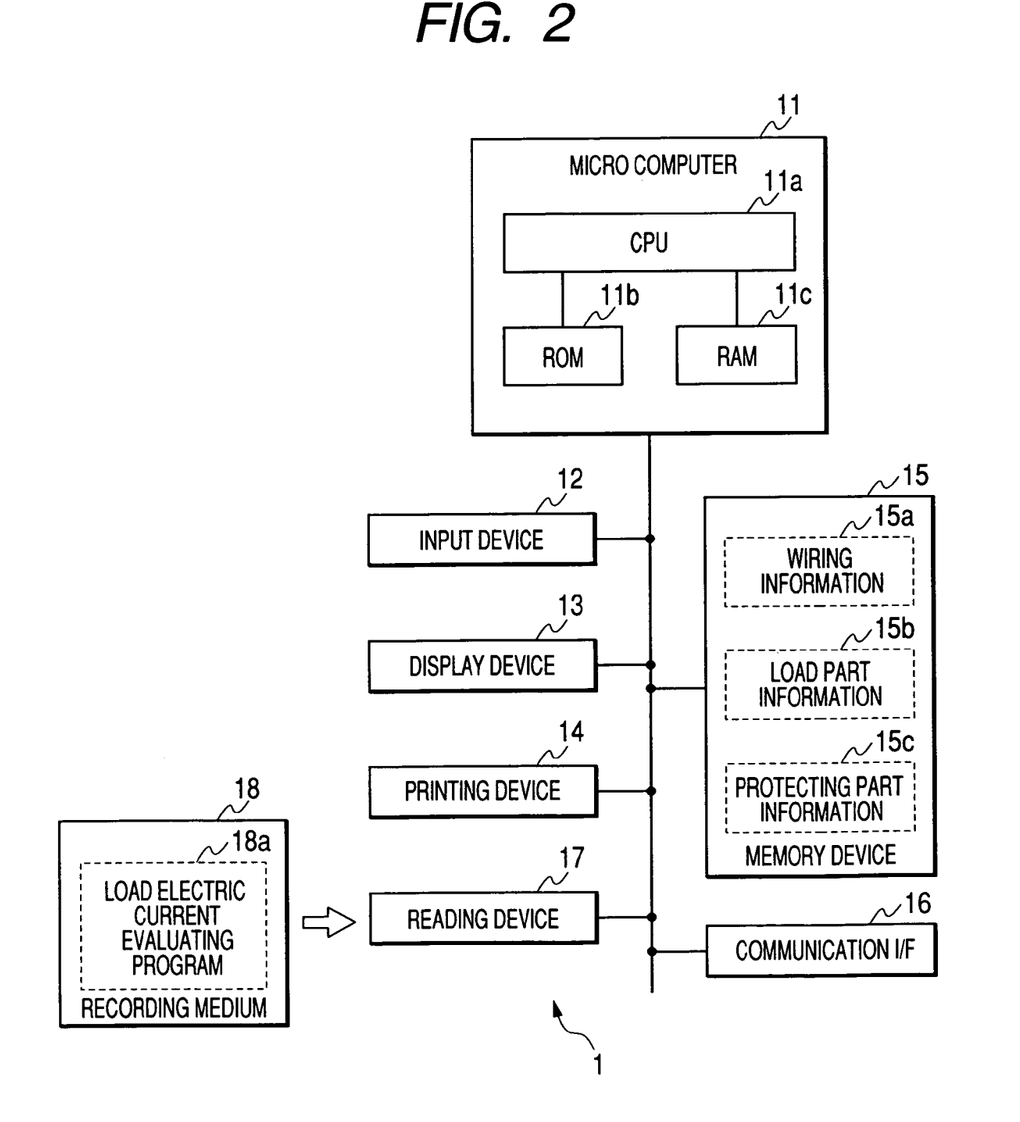
FIG. 2 is a block constructional diagram showing a hardware construction in accordance with an embodiment of the present invention.

Next, one example of a hardware construction and the load part information in the load electric current evaluating device of the present invention will be explained. FIG. 2 is a block constructional view showing the hardware construction in the embodiment of the present invention.

As shown in FIG. 2, the load electric current evaluating device 1 is realized by e.g., a personal computer constructed by including a microcomputer 11, an input device 12, a display device 13, a printing device 14, a memory device 15, a communication interface 16 and a reading device 17. The microcomputer 11 includes a CPU 11a (central processing unit), a ROM 11b for storing a boot program, etc., and a RAM 11c for temporarily storing various kinds of processing results. The input device 12 is a keyboard, a mouse, etc. for inputting the above respective values, etc. The display device 13 is a CRT, etc. for displaying a processing result. The printing device 14 is a printer for printing the processing result. The memory device 15 is a portable type recording medium such as a hard disk drive, a compact disk, etc., for storing the processing result. The communication interface 16 is a modem board, etc. for performing data communication with an external device by using e.g., a LAN line. The reading device 17 is a device for reading a load electric current evaluation program 18a shown in FIGS. 3 and 4 and stored to a recording medium 18 such as a CD-R, etc. These constructional elements are connected to each other through an internal bus.

The CPU 11a is started in accordance with the boot program stored to the ROM 11b. The CPU 11a performs processing, etc. relating to the present invention in accordance with the load electric current evaluation program 18a read by the reading device 17 and installed to the memory device 15, and performs an output operation from the display device 13 and the printing device 14, and stores its result to the memory device 15. The load electric current evaluation program 18a can be also installed to another computer having the above construction, and makes this computer function as a load electric current evaluating device after the installation. The load electric current evaluation program 18a may be also a program provided via a communication line of the Internet, the LAN, etc. as well as the recording medium 18. The procedure of processing in the present invention performed by this load electric current evaluating device 1 will be described later by using FIGS. 3 and 4.

At least wiring information 15a, load part information 15b and protecting part information 15c are stored to the above memory device 15. In addition to this, electric wire information may be also included in the memory device 15.

For example, the wiring information 15a is information showing an electric wiring layout designed by a predetermined wiring simulator as shown in JP-A-2002-24314 and including a load part, an electric wire, a switching device, an electric power source, etc. A protecting member adapted for every load part is allocated in this electric wiring. The respective names of the load part, the electric wire and the switching device within this electric wiring are also set to correspond to each other. Therefore, it is also possible to specify their arranging places, e.g., whether these members are arranged in an engine room, or are arranged indoors, etc. Information as to which vehicle maker this information is directed to is also included in the wiring information 15a.

The load part information 15b is information showing electric characteristics for every load part. For example, a valve, a lamp, a motor, etc. are examples of a load part. The electric characteristics include a resistance value for every load part and may also include peculiar voltage electric current characteristics etc. for every load part.

The protecting part information 15c is information showing electric characteristics for every protecting part. A fuse, a fusible link, a circuit breaker, a mini-fusible link, etc. are examples of the protecting part. However, these members are basically equivalent to each other as a function in points respectively having rated values and protecting the protecting part from an excessive load electric current. The resistance value, rating and kind of the protecting part are included in the protecting part information 15c, and information of the kind of a fuse box, etc. is also included in the protecting part information 15c when the protecting part is a fuse.

Figure 3:
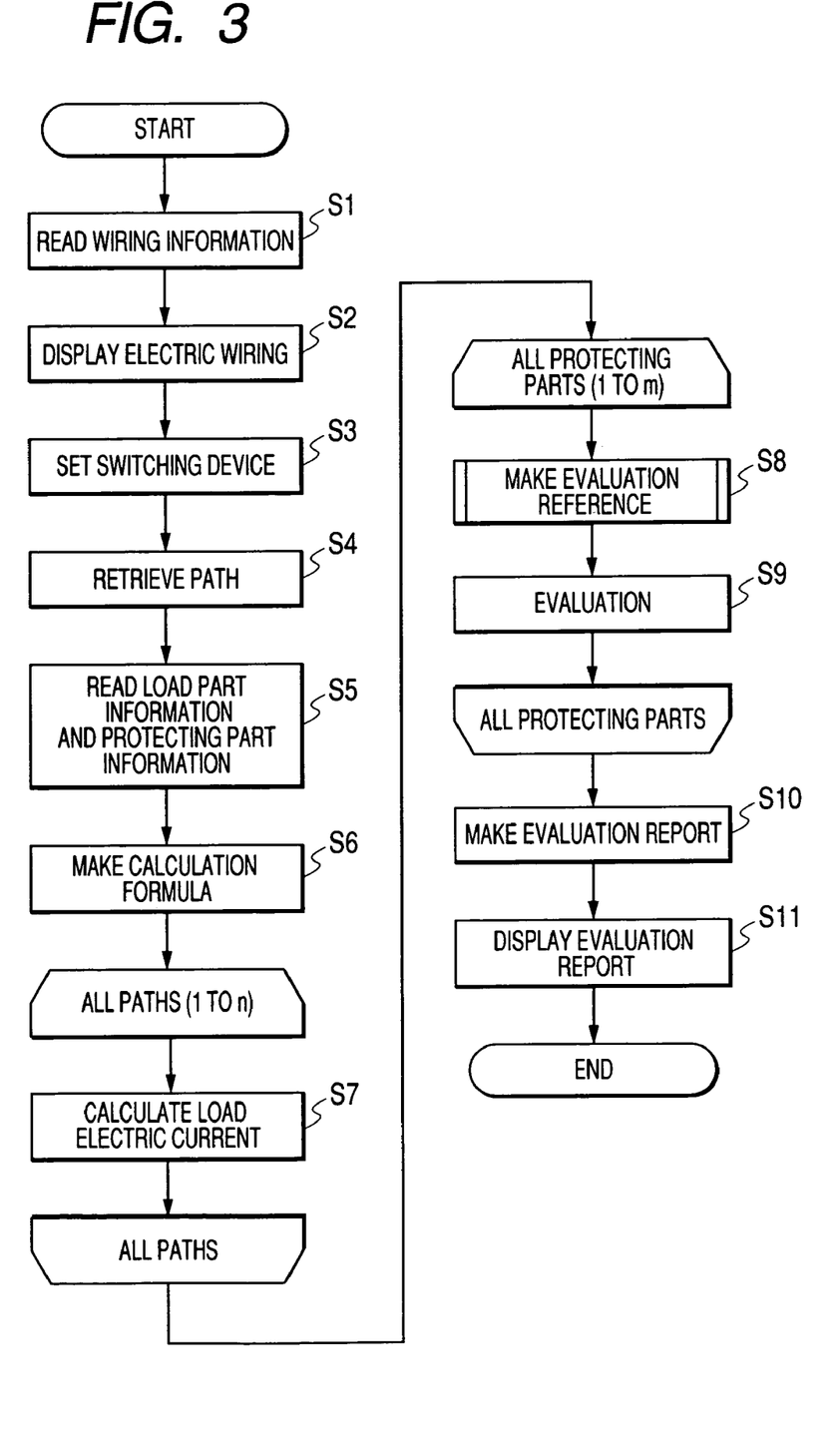
FIG. 3 is a flow chart showing a main processing procedure in accordance with the embodiment of the present invention.
Figure 4:
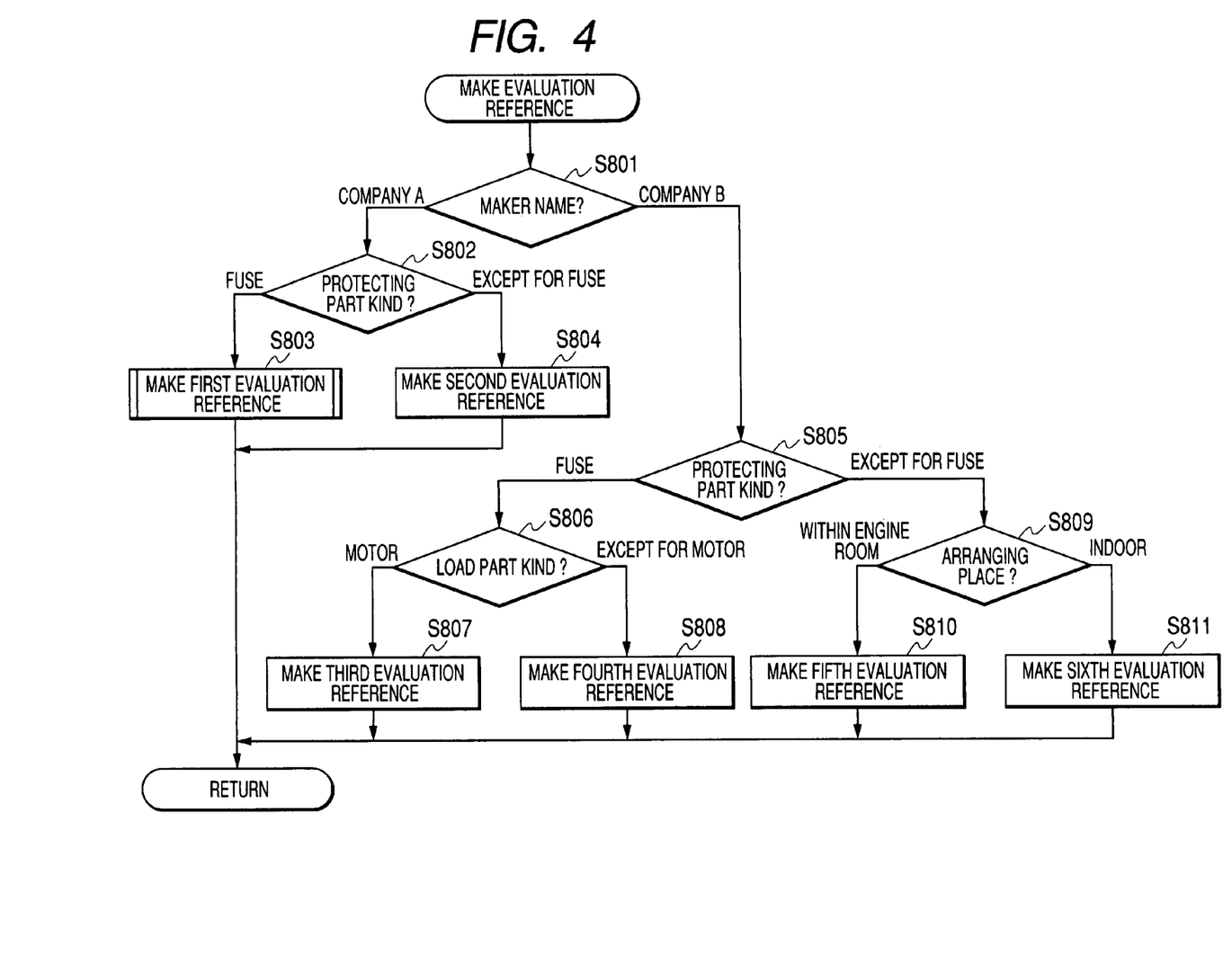
FIG. 4 is a flow chart showing each processing procedure relating to the making of an evaluation reference within FIG. 3.
Figure 5:
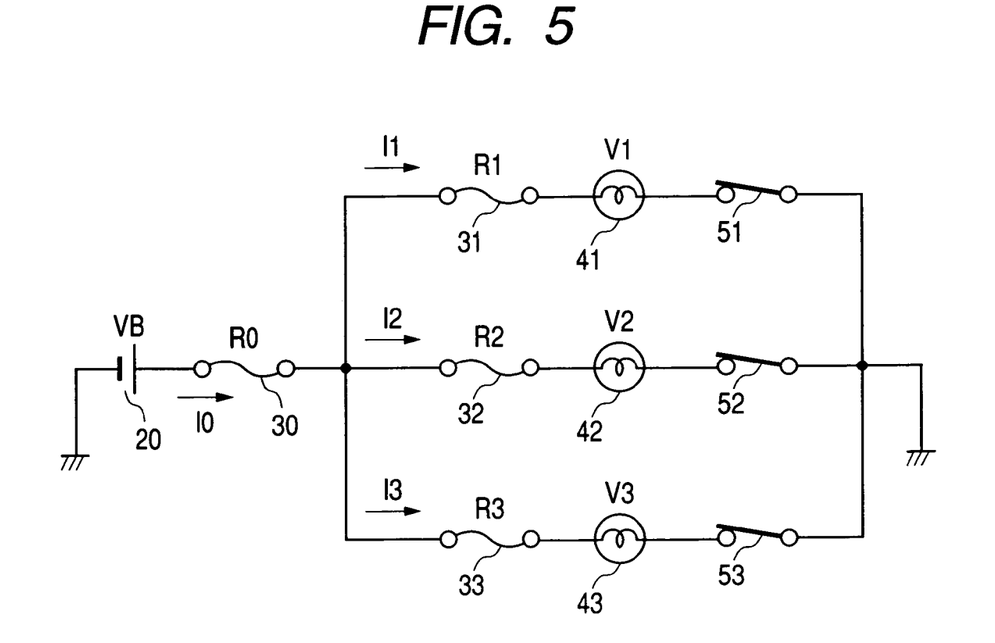
FIG. 5 is a view schematically showing electric wiring to explain a calculation formula in calculating a load electric current.
Figure 6:
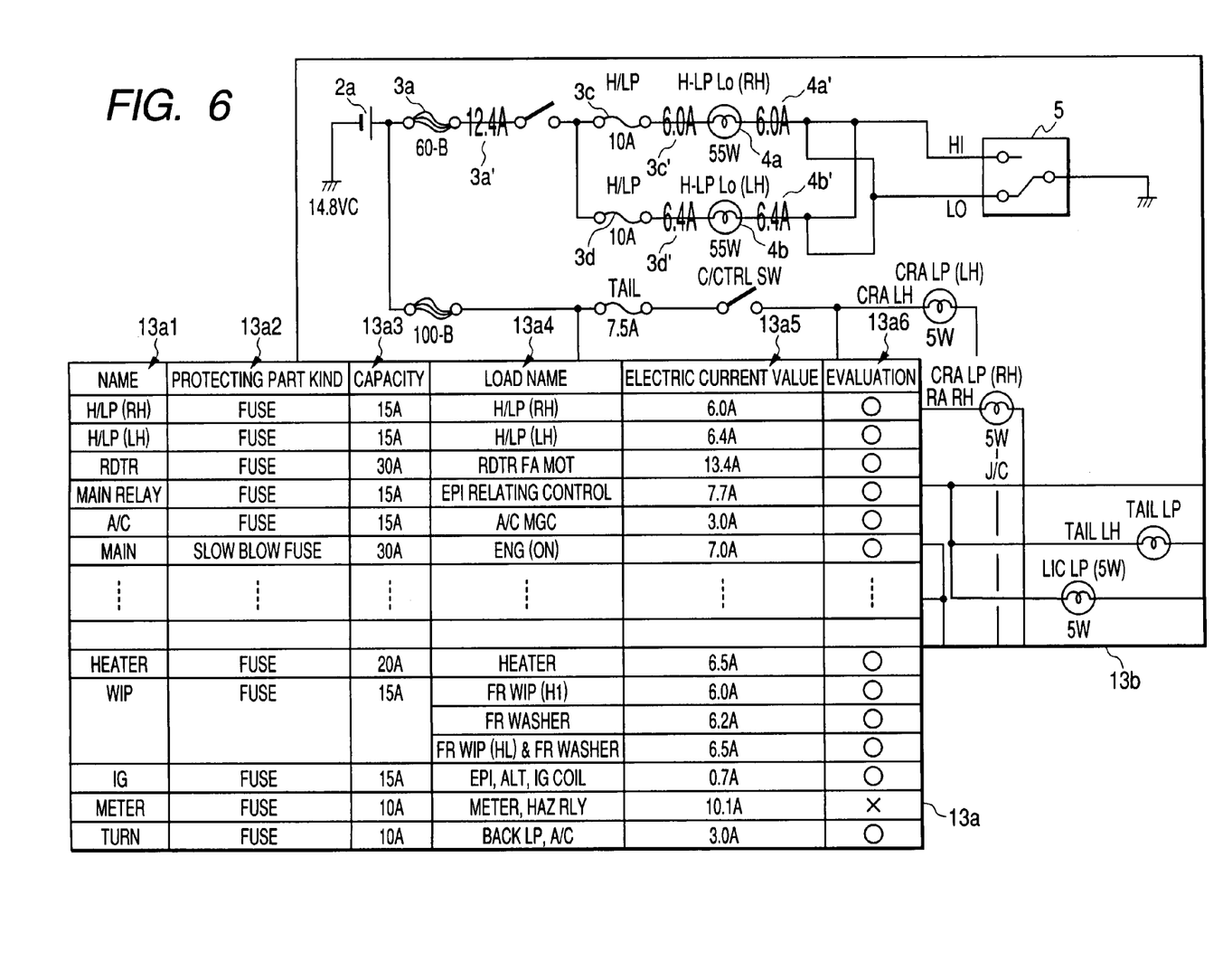
FIG. 6 is a view illustrating an evaluation report displayed by the processing procedures of FIGS. 3 and 4.

Next, a processing procedure in accordance with the embodiment of the present invention will be explained by using the flow charts of FIGS. 3 and 4 with reference to the explanatory views of FIGS. 5 and 6. FIG. 3 is a flow chart showing a main processing procedure in accordance with the embodiment of the present invention. FIG. 4 is a flow chart showing a processing procedure relating to the making of an evaluation reference within FIG. 3. FIG. 5 is a view schematically showing electric wiring to explain a calculation formula when the load electric current is calculated. FIG. 6 is a view illustrating an evaluation report displayed by the processing procedures of FIGS. 3 and 4.

First, the above wiring information 15a stored to the memory device 15 is read in a step S1 of FIG. 3, and electric wiring is displayed on the display device 13 in a step S2 on the basis of this wiring information 15a. The electric wiring may be also set to electric wiring newly made this time by utilizing the above technique of JP-A-2002-24314 instead of such reading and display.

With respect to such electric wiring, a switching device is next set in a step S3. For example, the switching device is a switch and a relay in the electric wiring displayed on the display device 13, and is set to a predetermined switching state. The switching state is set to e.g., a high position or a low position, etc. of a head light. Since the adaptability of the load electric current corresponding to the state of the switching device set here is evaluated, the adaptability of a more realistic load electric current can be evaluated.

Next, a path is retrieved in a step S4. Namely, a path, etc. required to calculate the load electric current in the electric wiring and corresponding to the switching state of the above switching device are retrieved here.

Next, load part information and protecting part information respectively corresponding to respective load part and protecting part on the above retrieved path are read from the memory device 15 in a step S5. The read information also includes information relating to resistance values included in the load part information and the protecting part information. Information relating to the resistance value of an electric wire included in the electric wiring may be also read and utilized to further improve accuracy. Since the information including the above wiring information 15a and read here is also utilized in processing described later, the read information is stored to a work area of the RAM 11c to shorten a processing time until the processing described later is terminated.

The calculation formula is then made in a step S6. Namely, the well-known Kirchhoff's law, the Ohm's law, the above voltage electric current characteristics, etc. are applied to the retrieved path, and a calculation formula constructed by plural equations is made. Here, how to make this calculation formula will be briefly explained below by using FIG. 5.

It is here supposed that the electric wiring designed in advance and the switching state of the switching device are set as shown in FIG. 5. Namely, this electric wiring is constructed from an electric power source 20, fuses 30 to 33, valves 41 to 43, switching devices 51 to 53 and an electric wire for connecting these members. Each information relating to the electric power source 20, the fuses 30 to 33 and the valves 41 to 43 on the path required to calculate the load electric current is read and the calculation formula is made.

In FIG. 5, when the voltage of the electric power source 20 is set to VB and the loads of the fuses 30 to 33 are set to R0 to R3 and the load electric currents on the respective paths are set to I0 to I3 and the voltages relating to the loads R0 to R3 are set to V1 to V3, the following calculation formula $$I0=I1+I2+I3$$

can be first made by utilizing the first Kirchhoff's law and the following calculation formulas $$V1=VB-(R0*I0+R1*I1)$$

$$V2=VB-(R0*I0+R2*I2)$$

$$V3=VB-(R0*I0+R3*I3)$$

can be made by utilizing the second Kirchhoff's law.

The load electric currents in all the paths (n-paths are here set) are calculated in a step S7 on the basis of these calculation formulas and the well-known Ohm's law. Each of the calculated load electric currents may be synthesized and displayed in the electric wiring already displayed in the display device 13.

Next, an evaluation reference relating to all the protecting parts (m protecting parts are here set) is made in a step S8. These evaluations are made on the basis of the evaluation reference made in a step S9. The making of the evaluation reference of the step S8 will be next additionally explained by using FIG. 4.

Namely, in processing relating to the making of the evaluation reference shown in FIG. 4, a company name is first judged in a step S801. Here, for example, it is supposed that there are two names constructed by companies A and B in the maker name. Since the maker name is included in the wiring information 15*a* as mentioned above, the maker name of the electric wiring including a pertinent protecting part can be obtained from this information 15*a*.

When it is judged as the company A in the step S801, it proceeds to a step S802 and the kind of the protecting part is judged. Since the kind of the protecting part is included in the protecting part information 15*c* as mentioned above, the kind of the pertinent protecting part can be obtained from this information 15*c*.

When it is judged in the step S802 that the protecting part is a fuse, it proceeds to a step S803 and a first evaluation reference is made. In contrast to this, when it is judged that the protecting part is a part except for a fuse, it proceeds to a step S804 and a second evaluation reference is made. Here, an explanation will be added by using the making of the first evaluation reference as one example of the making of the evaluation reference.

Namely, in the first evaluation reference, for example, a fuse rated value and a load electric current/(load kind*circumferential temperature*fuse box kind*rush current waveform) are compared. In this case, the fuse rated value, the load kind and the rush current waveform can be obtained from the above load part information 15*b* and the protecting part information 15*c*. More particularly, coefficients different in continuous and intermittent cases are allocated in the load kind. Coefficients different in the case of a lamp load and the case of a motor and a solenoid are allocated in the rush current waveform. These coefficients are determined in advance by a test, etc.

The circumferential temperature and the fuse box kind can be obtained from the above wiring information 15*a*. More particularly, coefficients different in the arranging case of this fuse in an engine room and the indoor arranging case of this fuse are allocated with respect to the circumferential temperature. Coefficients different in a case within the fuse box and a case within a junction block are allocated in the fuse box kind. These coefficients are determined in advance by a test, etc.

These values are applied to the above comparison formulas and the first evaluation reference is made. Since this evaluation reference becomes a comparison formula of the rated value of the fuse and the load electric current multiplied by a coefficient, it is very clear and the adaptability of the load electric current can be accurately evaluated. In the case of the making of the second evaluation reference of a step S804, the evaluation reference is also made such that the comparison of a value obtained by multiplying the rated value of a load part except for the fuse, e.g., a fusible link and a circuit breaker by a coefficient, and a value obtained by multiplying the load electric current by a coefficient is set to a base.

In contrast to this, when it is judged in the step S801 that the maker name is company B, it proceeds to a step S805 and the kind of the protecting part is first judged similarly to the above step S802. When the protecting part is here a fuse, it is judged in a step S806 whether the kind of the load part is a motor or a part except for the motor. A third evaluation reference (step S807) and a fourth evaluation reference (step S808) are respectively made in accordance with this judging result. When the protecting part is a part except for the fuse in the step S805, it is judged in a step S809 whether the arranging place of the protecting part is within the engine room or is indoor. A fifth evaluation reference (step S810) and a sixth evaluation reference (step S811) are respectively made in accordance with this judging result. A detailed explanation of these evaluation references is omitted, but the comparison of the load electric current and the rated value of the protecting part multiplied by a coefficient is basically a base in each of the evaluation references. Accordingly, the reference is clear and the adaptability of the load electric current can be accurately evaluated. Here, a parameter included in each evaluation reference can be obtained from the above wiring information 15*a*, the load part information 15*b* and the protecting part information 15*c*.

Since the evaluation reference is classified into plural kinds as mentioned above, the evaluation reference adapted for each of various kinds of conditions and different parts can be made so that the adaptability of the load electric current can be more accurately evaluated. The kind of a vehicle mounting the electric wiring, i.e., identification information of a passenger car/a commercial business car, or a business car may be also utilized in making the evaluation reference although this construction is not illustrated in the drawings. At least one of the above plural parameters is referred in making the evaluation reference.

When the making of such an evaluation reference is terminated, an evaluation according to the evaluation reference, i.e., the evaluation of the adaptability of the load electric current is made in the step S9 of FIG. 3. The making of the evaluation reference of the step S8 and the evaluation of the step S9 are made with respect to all the protecting parts. When the evaluations with respect to all the protecting parts are terminated, it proceeds to steps S10 and S11.

An evaluation report is made in the step S10 and is displayed on the display device 13 in the step S11. FIG. 6 shows one example of this evaluation report. For example, only an evaluation report 13*a* of a table format, or an evaluation report 13*a* with an electric wiring diagram 13*b* can be displayed as the evaluation report. A name 13a1, a protecting part name 13a2, its capacity 13a3, a load name 13a4, a (load) electric current value 13a5 and an evaluation 13a6 (o shows adaptable and X shows inadaptable) are correspondingly displayed in the evaluation report 13a.

Here, when the electric wiring diagram 13b is displayed, calculated load electric currents 3a', 3c', 3d', and 4a', 4b' are respectively displayed correspondingly to respective load parts, i.e., fuses 3a, 3c, 3d and valves 4a, 4b. The evaluation result is very easily confirmed by such an evaluation report and an appropriate countermeasure is easily taken. Such an evaluation report may be also suitably printed on a paper sheet by the printing device 14 by operating the input device 12. The output is a concept including the printing on the paper sheet using the printing device 14 as well as the display on the display device 13.

INDUSTRIAL APPLICABILITY

Thus, in accordance with the embodiments of the present invention, the adaptability of the load electric current at the normal time in the electric wiring of the vehicle can be accurately evaluated. Further, the evaluation reference is clear and the adaptability of the load electric current in a different part can be accurately evaluated.

Further, the evaluation reference for evaluating the adaptability of the load electric current is made by utilizing the rated value of the protecting part with reference to the load part information and the protecting part information stored in advance. With reference to this evaluation reference, the adaptability of the load electric current flowing through a predetermined part at the normal time is evaluated in the electric wiring within the vehicle, and this evaluation result is outputted. Thus, since the rated value of the protecting part is utilized to make the evaluation reference of the load electric current, the evaluation reference is very clarified. Further, the adaptability of the load electric current at the normal time can be accurately evaluated while the evaluation reference is easily made.

Further, since the evaluation reference is constructed by a comparison formula in which the load electric current is multiplied by a predetermined coefficient together with the rated value of the protecting part, the adaptability of the load electric current at the normal time can be accurately evaluated while the evaluation reference is easily made.

The evaluation relating information includes information of at least one of the maker name of the vehicle mounting the electric wiring, the arranging place of the used protecting part, the circumferential temperature, and the kind of the vehicle mounting the electric wiring, and the evaluation reference is classified into plural kinds on the basis of these information. Accordingly, evaluation references respectively adapted for various kinds of conditions and different parts can be made, and the adaptability of the load electric current can be more accurately evaluated.

Further, the switching state of the switching device included in the electric wiring is set and the adaptability of each load electric current corresponding to the switching state can be evaluated. Accordingly, the adaptability of a more realistic load electric current can be evaluated.

An evaluation report for correspondingly setting the load part, the protecting part of this load part, the calculated load electric current and an evaluation result is made as the evaluation result. Accordingly, the evaluation result is easily confirmed in addition to the above effects.

Since the rated value of the protecting part is utilized to make the evaluation reference of the load electric current, the evaluation reference is very clarified. Further, the adaptability of the load electric current at the normal time can be accurately evaluated while the evaluation reference is easily made.

Further, a computer makes the evaluation reference for evaluating the adaptability of the load electric current by utilizing the rated value of the protecting part with reference to the load part information and the protecting part information stored in advance. With reference to this evaluation reference, the adaptability of the load electric current flowing through a predetermined part at the normal time is evaluated in the electric wiring within the vehicle, and this evaluation result is outputted. Thus, since the rated value of the protecting part is utilized to make the evaluation reference of the load electric current, the evaluation reference is very clarified. Further, the adaptability of the load electric current at the normal time can be accurately evaluated while the evaluation reference is easily made.

The present invention is not limited to the above embodiments, but can be variously changed in the scope not departing from the gist of the present invention. For example, when the evaluation reference is made, a maker number, the kind of the protecting part, a classifying method, etc. can be suitably changed. Further, the format of the evaluation report can be also suitably changed.

The invention claimed is:

1. A load electric current evaluating device, comprising:
a load electric current calculating section that calculates a load electric current flowing through a predetermined part of electric wiring including a load part, a protecting part for the load part, an electric wire and an electric power source at a normal operating time;
a storing section that stores load part information showing electric characteristics of the load part and protecting part information showing electric characteristics and a rated value of the protecting part;
an information reading section that reads the load part information and the protecting part information from the storing section;
an evaluation reference providing section that provides an evaluation reference for evaluating adaptability of the load electric current flowing through the predetermined part at the normal operating time with reference to the load part information and the protecting part information;
an evaluating section that evaluates the adaptability of the calculated load electric current on the basis of the evaluation reference; and
an output section that outputs an evaluation result provided by the evaluating section,
wherein the evaluation reference is constructed by a comparison formula in which the load electric current is multiplied by a predetermined coefficient together with the rated value of the protecting part.

2. The load electric current evaluating device according to claim 1, wherein the storing section stores evaluation relating information;
wherein the evaluation relating information includes information of at least one of a maker name of a vehicle mounting the electric wiring, an arranging place of the protecting part and the kind of the vehicle on which the electric wiring is mounted; and
wherein the evaluation reference is classified into plural kinds on the basis of the evaluation relating information, the load part information and the protecting part information.

3. The load electric current evaluating device according to claim 1, wherein the electric wiring includes a switching device, and
the load electric current evaluating device, further includes:
a switching device setting section that sets a switching state of the switching device; and
a path retrieving section that retrieves a path corresponding to the switching state and required to calculate the load electric current in the electric wiring.

4. The load electric current evaluating device according to claim 1, further comprising an evaluation report providing section that makes an evaluation report as the evaluation result, the evaluation report being related to the load part, the protecting part for the load part, the calculated load electric current and the evaluation result.

5. A load electric current evaluating method, comprising:
a load electric current calculating process for calculating a load electric current flowing through a predetermined part of electric wiring including a load part, a protecting part for the load part, an electric wire and an electric power source at a normal operating time;
an information reading process for reading load part information showing electric characteristics of the load part and protecting part information showing electric characteristics and a rated value of the protecting part;
an evaluation reference providing process for making an evaluation reference for evaluating adaptability of the load electric current flowing through the predetermined part at the normal operating time with reference to the load part information and the protecting part information;
an evaluating process for evaluating the adaptability of the calculated load electric current on the basis of the evaluation reference; and
an output process for outputting an evaluation result provided by the evaluating process,
wherein the evaluation reference is constructed by a comparison formula in which the load electric current is multiplied by a predetermined coefficient together with the rated value of the protecting part.

6. A computer-readable medium storing a control program, which when executed causes a computer to carry out a load electric current evaluating method, the method comprising:
a load electric current calculating process for calculating a load electric current flowing through a predetermined part of electric wiring including a load part, a protecting part for the load part, an electric wire and an electric power source at a normal operating time;
an information reading process for reading load part information showing electric characteristics of the load part and protecting part information showing electric characteristics and a rated value of the protecting part;
an evaluation reference providing process for making an evaluation reference for evaluating adaptability of the load electric current flowing through the predetermined part at the normal operating time with reference to the load part information and the protecting part information;
an evaluating process for evaluating the adaptability of the calculated load electric current on the basis of the evaluation reference; and
an output process for outputting an evaluation result provided by the evaluating process,
wherein the evaluation reference is constructed by a comparison formula in which the load electric current is multiplied by a predetermined coefficient together with the rated value of the protecting part.

\* \* \* \* \*